(12) United States Patent
Yang et al.

(10) Patent No.: US 7,852,246 B2
(45) Date of Patent: Dec. 14, 2010

(54) ANALOGUE/DIGITAL CONVERTER DEVICE

(75) Inventors: Chongshan Yang, Mie-Ken (JP);
Hiroshi Ozaki, Kanagawa-Ken (JP);
Kazuya Yasui, Kanagawa-Ken (JP);
Masafumi Ban, Tokyo (JP)

(73) Assignees: Kabushiki Kaisha Toshiba, Tokyo (JP);
Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/813,138

(22) PCT Filed: Jan. 31, 2007

(86) PCT No.: PCT/JP2007/000042

§ 371 (c)(1),
(2), (4) Date: Jun. 29, 2007

(87) PCT Pub. No.: WO2007/088706

PCT Pub. Date: Aug. 9, 2007

(65) Prior Publication Data

US 2009/0278717 A1    Nov. 12, 2009

(30) Foreign Application Priority Data

Feb. 2, 2006  (JP) .............................. 2006-026203

(51) Int. Cl.
*H03M 1/00* (2006.01)

(52) U.S. Cl. ....................................... 341/141; 341/155

(58) Field of Classification Search ................. 341/141, 341/155, 120, 118, 172
See application file for complete search history.

(56) References Cited

U.S. PATENT DOCUMENTS

| 5,172,116 A | 12/1992 | Noma |
| 6,486,809 B1 * | 11/2002 | Figoli .......................... 341/141 |
| 2003/0120724 A1 * | 6/2003 | Kawashimo et al. ........ 709/203 |

FOREIGN PATENT DOCUMENTS

| JP | 63-304314 | 12/1988 |
| JP | 4-88723 | 3/1992 |
| JP | 9 269870 | 10/1997 |

\* cited by examiner

*Primary Examiner*—Rexford N Barnie
*Assistant Examiner*—Joseph Lauture
(74) *Attorney, Agent, or Firm*—Oblon, Spivak, McClelland, Maier & Neustadt, L.L.P.

(57) ABSTRACT

In a scanning mode: a conversion sequence setting register sets the sequence in which analogue signals are to be converted; a multiplexer selects a single analogue signal sequentially from a plurality of analogue signals, in accordance with the order that is set in this conversion sequence setting register; an A/D converter converts the analogue signal selected by this multiplexer to a digital signal; a conversion result register having a plurality of result registers stores the digital signal obtained by conversion by the A/D converter in these storage regions in the order in which conversion was effected; and a back-up register includes result registers respectively corresponding to this plurality of result registers.

9 Claims, 6 Drawing Sheets

ANALOGUE/DIGITAL CONVERTER DEVICE

TECHNICAL FIELD

The present invention relates to an analogue/digital (hereinbelow referred to as "A/D") conversion device that changes over a plurality of analogue input channels and converts an analogue input signal into a digital signal.

BACKGROUND ART

FIG. 1 is a layout diagram of a conventional A/D conversion device as described in Japanese Laid-open Patent Application No. H. 9-269870.

This A/D conversion device comprises: a multiplexer (MPX) 1 that selects and outputs one of n-channel analogue signals than are input from n input terminals AI0 to AIn-1; an A/D converter (ADC) 2 that converts the analogue signal that is supplied from the multiplexer 1 to a digital signal and outputs this digital signal; a conversion result register 3 that holds the converted digital signal; and a plurality of control registers 4 in which are set for example operating instructions from a CPU or the like, through a bus 9. Also, this A/D conversion device comprises: a sequencer 5 that controls the multiplexer 1, A/D converter 2 and for example the conversion result register 3 in accordance with the set values of the control register 4, and decoders (DEC) 6, 7 that control changeover of the multiplexer 1 and the conversion result register 3, respectively, in accordance with instructions from this sequencer 5.

The control register 4 comprises for example a start/stop instruction register 4a for inputting start and stop instructions for A/D conversion; a conversion mode setting register 4c for setting the conversion mode to scanning mode or select mode; and a conversion channel setting register 4b for setting the initial channel or the selected channel of scanning.

In this A/D conversion device, when scanning mode is set in the conversion mode setting register 4c, for example "n-2" is set in the conversion channel setting register 4b, and, in addition, a start instruction is set in the start/stop instruction register 4a, A/D conversion in accordance with scanning mode is commenced. In this case, "n-2", which was first of all set in the conversion channel setting register 4b, is supplied to the decoders 6, 7, causing the input signal of the input terminal AIn-2 that is selected by the multiplexer 1 to be converted to a digital signal by the A/D converter 2, and to be stored in the result register RRn-2 of the conversion result register 3. Next, the value of the conversion channel setting register 4c is decremented by 1, becoming "n-3", and the input signal of the input terminal AIn-3 is converted to a digital signal and is stored in the result register RRn-3 of the conversion result register 3. The same processing is successively performed as far as the input signal of input terminal AI0, the conversion result of the input signal of this input terminal AI0 is stored in the result register RR0, and A/D conversion in accordance with scanning mode is thereby completed. After this, the conversion result that was stored in the result registers RR0 to RRn-2 of the conversion result register 3 is read via the bus 9 by the CPU or the like. When a complete scanning mode conversion cycle has been completed, a condition is produced in the conversion mode setting register 4c in which the continuous scanning mode can be set, in which a scanning mode conversion cycle can again be repeated: when the continuous scanning mode has been set, the scanning mode operation as described above is repeated.

On the other hand, when select mode is set in the conversion mode setting register 4c, for example "n-2" is set in the conversion channel setting register 4b, and, in addition, a start instruction is set in the start/stop instruction register 4a, A/D conversion is performed in accordance with the select mode. In this case, "n-2" that was set in the conversion channel setting register 4b is supplied to the decoders 6, 7 and the input signal of the input terminal AIn-2 selected by the multiplexer 1 is converted to a digital signal by the ADC2, and stored in the result register RRn-2 of the conversion result register 3. In this way, A/D conversion in accordance with the select mode is completed. Thereafter, the conversion result stored in the result register RRn-2 of the conversion result register 3 is read by the CPU or the like via the bus 9.

In this way, in this A/D conversion device, a scanning mode for continuous A/D conversion of a plurality of input signals in a fixed order, and a select mode for individual A/D conversion of any desired input signal with any desired timing are provided, so these two conversion modes can be separately employed as needed.

However, the A/D conversion device described above was subject to the following problems.

For example, when used in engine control of an automobile, the input signals may include the rotational speed of the engine or vehicle wheels, the running speed of the vehicle, and the temperature of the engine or external atmosphere, the sensors used to detect these being arranged in respectively different locations and being connected with the A/D conversion device through cables.

In addition, the type and number of sensors depends on the type of vehicle and the form thereof. Consequently, in the scanning mode of a conventional A/D conversion device, the sequence of connection of the cables from the sensors must be decided beforehand, in order to process these input signals, and there was therefore the problem of a lack of flexibility.

Also, in the case where it was required for example to input an input signal of a high degree of urgency twice during a single scan, it was necessary to connect a cable from a single sensor to two input terminals, giving rise to problems in terms of hardware limitations.

In the case where it is necessary to convert a specified analogue input signal a plurality of times, this can be achieved by the continuous scanning mode, but time is wasted in conversion of unrequired analogue input signals other than the specified analogue input signal. In order to avoid this, the means adopted in a conventional A/D conversion device was that the same operation was repeated by software so as to effect conversion exclusively of the analogue input signal that was selected by the select mode, and the conversion start timing had to be controlled by software: this led to the problem of incurring a considerable software processing load. This problem becomes marked when calculating the differential of a designated analogue input signal with a converted digital value.

Also, when a plurality of analogue signals were continuously converted to digital signals, although an interrupt or the like indicating completion of conversion was employed in order to perform reading of the conversion result register data through the bus connected with the CPU or the like, it was necessary to read all of the conversion result register data as far as the next conversion, and this presented the problem of imposing restrictions on software processing.

SUMMARY OF THE INVENTION

Accordingly an advantage of an aspect of the present invention is to provide an A/D conversion device wherein the A/D conversion sequence in the scanning mode can be set at will by software but the start timing of conversion is a fixed time than is not subject to software control, and the time required for reading the conversion result data is unrestricted compared with a conventional A/D conversion device; and wherein the software processing load is thereby greatly reduced.

In order to achieve the above aspect, an A/D conversion device according to the present invention is constructed as follows. Specifically, according to the invention there is provided an analogue/digital conversion device comprising:

a conversion sequence setting register wherein the order wherein the analogue signals are converted when a plurality of analogue signals are consecutively converted to digital signals is set;

a multiplexer that selects sequentially a single analogue signal from said plurality of analogue signals, in an order that is set in this conversion sequence setting register;

an A/D converter that converts the analogue signal that is selected by this multiplexer to a digital signal; and a conversion result register having a plurality of storage regions, that stores the digital signal obtained as a result of the conversion by this A/D converter in the storage regions in the order with which conversion was effected.

Furthermore, an A/D conversion device according to the present invention may be constructed as follows. Specifically, an A/D conversion device according to the present invention may comprise:

a conversion sequence setting register wherein the order wherein the analogue signals are converted when a plurality of analogue signals are consecutively converted to digital signals is set;

a multiplexer that selects sequentially a single analogue signal from said plurality of analogue signals, in an order that is set in this conversion sequence setting register;

an A/D converter that converts the analogue signal that is selected by this multiplexer to a digital signal;

a conversion result register having a plurality of storage regions, that stores the digital signal obtained as a result of the conversion by said A/D converter in the storage regions in the order with which conversion was effected; and a back-up register in which the data of the conversion result register is saved.

BEST MODE FOR CARRYING OUT THE INVENTION

The above and other objects of the present invention and novel features thereof will be more completely understood on reading the description of the following preferred embodiments in conjunction with the accompanying drawings. It should be noted that the drawings are merely given by way of explanation and are not intended to restrict the scope of the present invention.

First Embodiment

A first embodiment of the present invention is described below with reference to the accompanying drawings.

Figure 1:
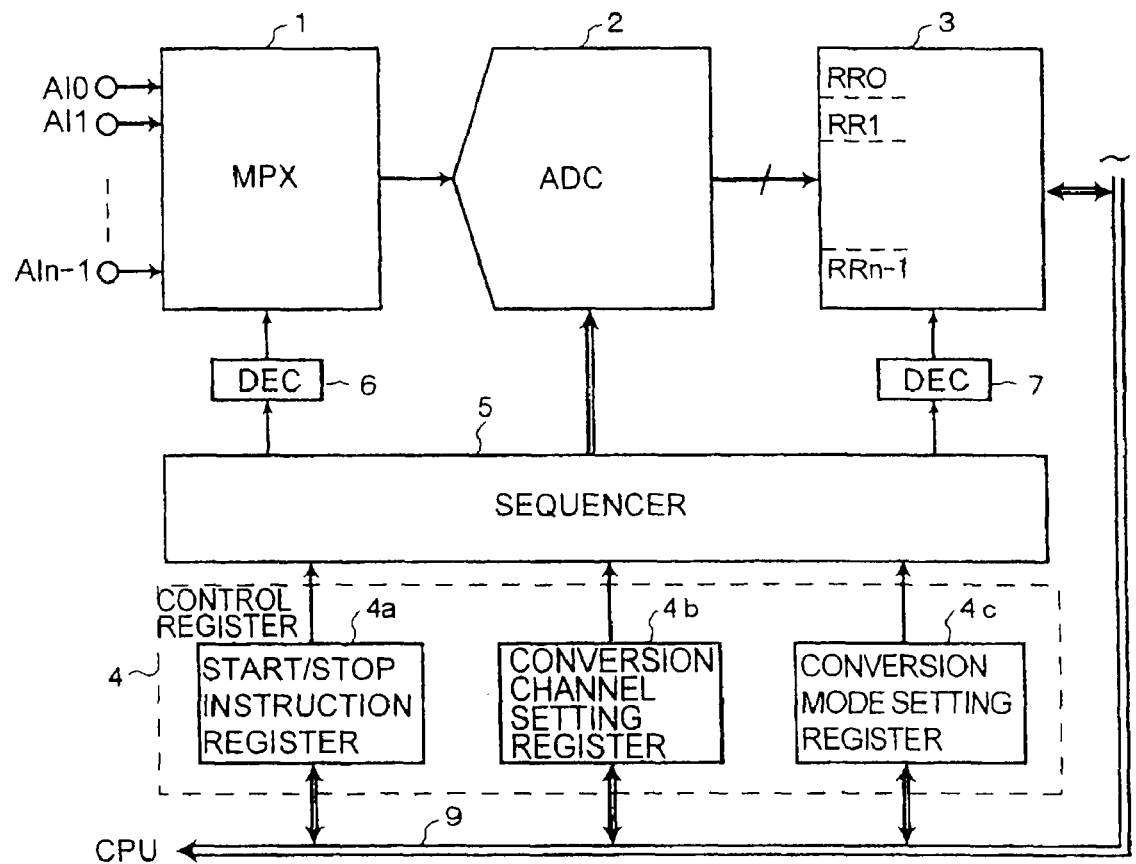
FIG. 1 is a layout diagram of a conventional A/D conversion device.
Figure 2:
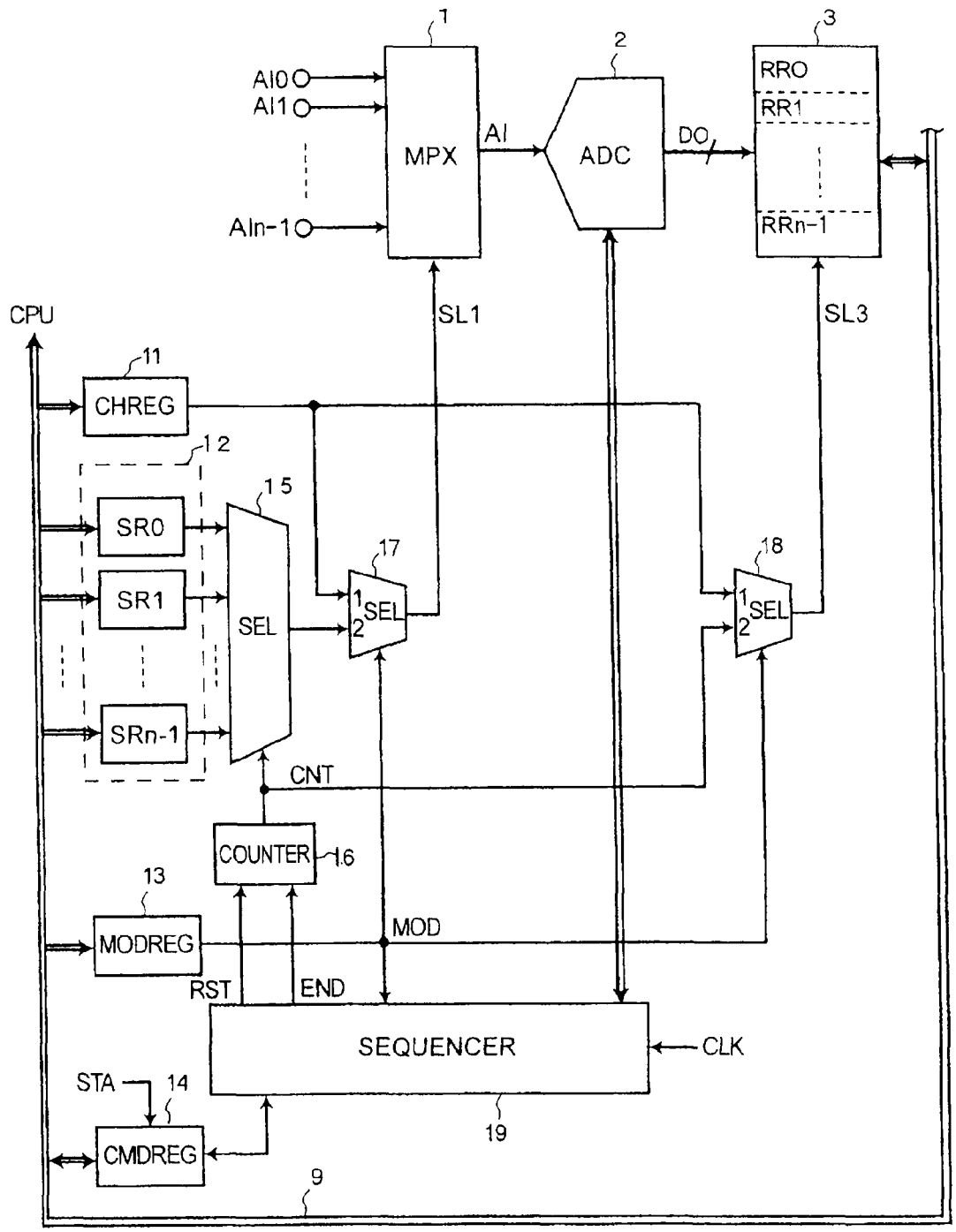
FIG. 2 is a layout diagram of an A/D conversion device 1 illustrating a first embodiment of the present invention.

FIG. 2 is a layout diagram of an A/D conversion device illustrating a first embodiment of the present invention; elements that are common with elements in FIG. 1 are given the same reference numerals.

This A/D conversion device is equipped with two conversion modes, namely, a select mode and a scanning mode, and comprises: a multiplexer 1 that selects and outputs one of n-channel analogue signals that are input from n input terminals AI0 to AIn-1; an ADC2 that converts the analogue signals AI that are supplied from this multiplexer 1 into digital signals DO and outputs these; and a conversion result register 3 constituted by n result registers RR0 to RRn-1 for holding the digital signal DO obtained by this conversion.

Also, this A/D conversion device comprises: a conversion channel setting register (CHREG) 11 for specifying the conversion channel in the case of the select mode; a conversion sequence setting register 12 for specifying the sequence of conversion channels in the case of the scanning mode; a mode setting register (MODREG) 13 for setting the conversion mode MOD; and a command register (CMDREG) 14 for inputting a start or stop instruction in respect of A/D conversion. Of these, the conversion sequence setting register 12 is constituted by n registers, from the scanning sequence register SR0 for specifying the input channel that is to be converted first in the scanning mode to the scanning sequence register SRn-1 for specifying the input channel that is to be converted last (i.e. the n-th channel). These registers 3, 11 to 14 are connected to a processor such as a CPU, not shown, through a bus 9. It should be noted that the command register 14 is constructed so as to be capable of receiving instructions such as start of A/D conversion by means for example of a start signal STA from other peripheral equipment apart from the bus 9.

The scanning sequence registers SR0 to SRn-1 of the conversion sequence setting register 12 are respectively connected with the first to n-th inputs of the n-input selector (SEL) 15. The selector 15 selects an input side in accordance with the count value CNT of the counter 16; the output side of this selector 15 is connected with the second input side of the selectors 17. The selector 17 selects the first or second input in accordance with the conversion mode MOD that is set in the mode selection register 13, and supplies the set value of the conversion channel setting register 11 to the first input.

In the case of the select mode, this selector 17 selects the first input, and in the case of the scanning mode, selects the second input; the selector 17 then outputs the selected signal as the selection signal SL1 to the multiplexer 1.

The set value of the conversion channel setting register 11 is further supplied to the first input 1 of the selector 18. The selector 18 selects the first or second input in accordance with the conversion mode MOD that is set in the mode setting register 13, and, in accordance therewith, the count value CNT of the counter 16 is supplied to the second input. This selector 18 selects the first input in the case of the select mode and selects the second input in the case of the scanning mode and outputs the selected signal as selection signal SL3 to the conversion result register 3.

In addition, this A/D conversion device comprises a sequencer 19 that performs A/D conversion processing in accordance with a conversion mode MOD that is set by the mode setting register 13 and a start or stop instruction that is set by the command register 14. This sequencer 19 performs control of conversion processing by the A/D converter 2 and performs control of the counter 16 when in scanning mode. Specifically, the sequencer 19 resets the count value CNT of the counter 16 to 0 by means of a reset signal RST on commencement of the scanning mode, and, every time conversion of a single input channel is completed, outputs a termination signal END and increments the count value CNT of this counter 16 by 1.

Next, the operation of the A/D conversion device of FIG. 2 will be described for the case of the select mode (1) and the scanning mode (2).

(1) Select Mode

In select mode, the input channel number (for example "1") that is the subject of conversion is set in the conversion channel setting register 11 and the mode signal MOD (for example, level "H") specifying the select mode is set in the mode setting register 13, after which an instruction for starting A/D conversion is set in the command register 14.

Since select mode is specified by the mode signal MOD, the first input is selected in the selectors 17, 18, and the set value "1" of the conversion channel setting register 11 is supplied respectively to the multiplexer 1 and the conversion result register 3 as the selection signals SL1, SL3.

In this way, in the case of the multiplexer 1, the input signal of the input terminal AI1 is selected and supplied as the analogue signal AI to the A/D converter 2. The A/D converter 2 performs A/D conversion processing under the control of the sequencer 19 and the digital signal DO obtained by this conversion is output to the conversion result register 3. The conversion result register 3 stores the digital signal DO in the result register RR1 in accordance with the selection signal SL3. A/D conversion in accordance with the select mode is thereby terminated. After this, the conversion result stored in the result register RR1 of the conversion result register 3 is read via the bus 9 by the CPU or the like.

(2) Scanning Mode

Figure 3A:
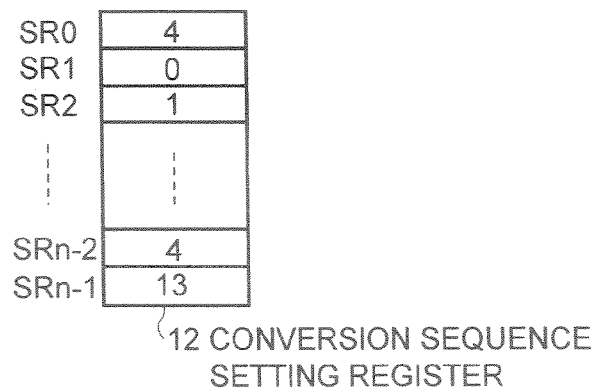
FIG. 3A is a diagram showing a conversion sequence setting register given in explanation of the operation of scanning mode in the A/D conversion device of FIG. 2.
Figure 3B:
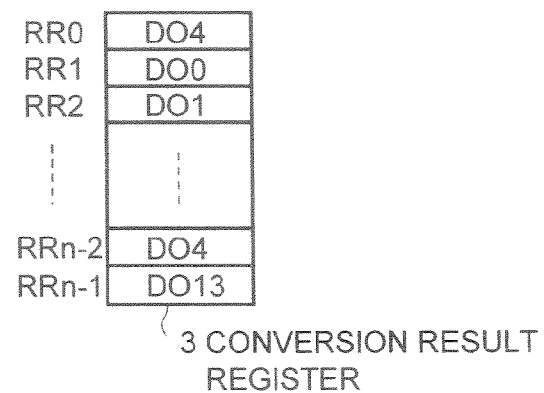
FIG. 3B is a diagram showing a conversion result register given in explanation of the operation of the operation of scanning mode in the A/D conversion device of FIG. 2.
Figure 3C:
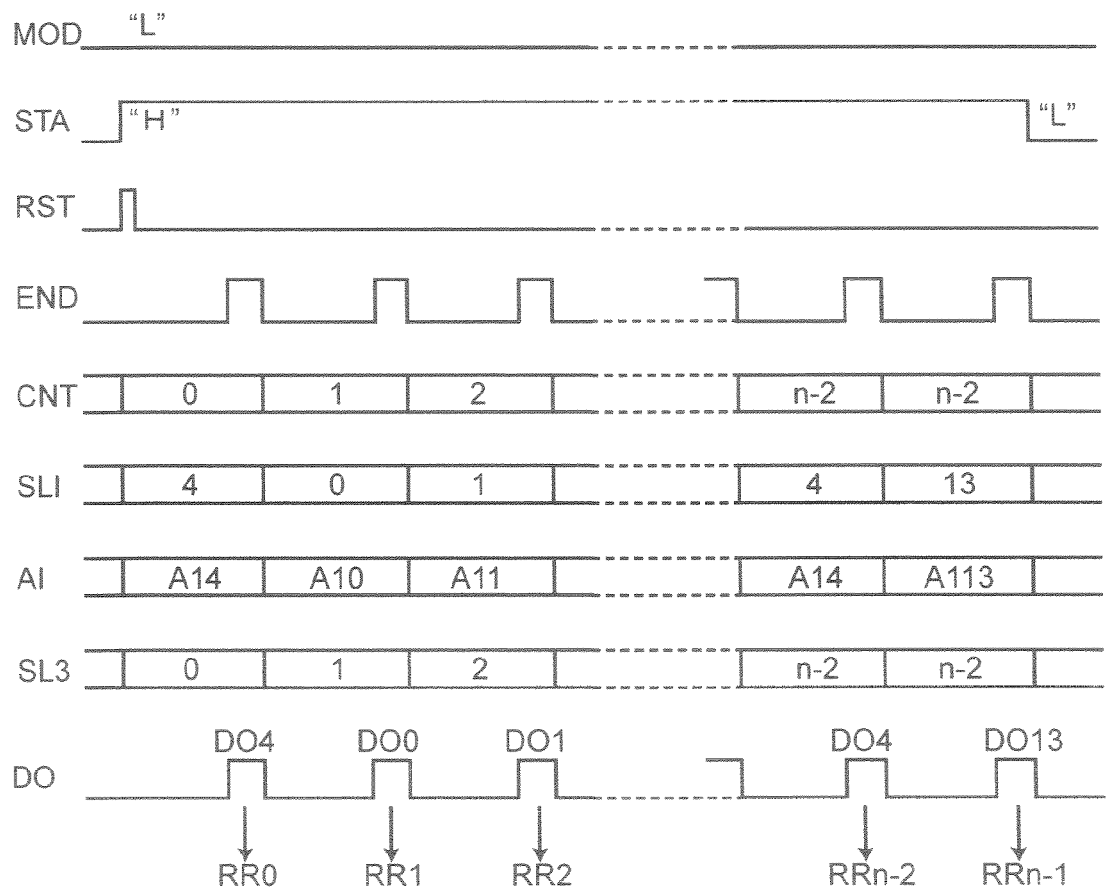
FIG. 3C is a timing chart given in explanation of the operation of scanning mode in the A/D conversion device of FIG. 2.

FIG. 3A, FIG. 3B and FIG. 3C are respectively: a diagram illustrating the conversion sequence setting register given in explanation of the operation of the scanning mode in the A/D conversion device of FIG. 2; a diagram illustrating the conversion result register given in explanation of the operation of the scanning mode in the A/D conversion device of FIG. 2; and a timing chart given in explanation of the operation of the scanning mode in the A/D conversion device of FIG. 2.

In the scanning mode, the number of the input channels for designating the sequence in which input signals are converted is set beforehand via a bus 9 from the CPU or the like in the scanning sequence registers SR0 to SRn-1 of the conversion sequence setting register 12. Also, the mode signal MOD (for example, level "L") designating the scanning mode is set in the mode setting register 13. After this, an instruction STA for starting A/D conversion is input to the command register 14. In this way, A/D conversion processing is started under the control of the sequencer 19. In this case, it will be assumed that respectively 4, 0, 1, . . . , 4, 13 are set in the scanning registers SR0, SR1, SR2, . . . , SRn-2 and SRn-1.

First of all, the counter 16 is reset by a reset signal RST, and the count value CNT therefore becomes 0. Since the count value CNT is 0, the scan register SR0 is selected by the selector 15 and the value 4 that is set in this scan register SR0 is supplied via the selector 17 to the multiplexer 1 as the selection signal SL1. In the multiplexer 1, the input signal of the input terminal AI4 is selected in accordance wish the selection signal SL1, and is supplied to the A/D converter 2 as the analogue signal AI. The A/D converter 2 performs A/D conversion processing under the control of the sequencer 19 and the digital signal DO (DO4) obtained as a result of this conversion is output to the conversion result register 3. Also, an end signal END is output from the sequencer 19.

In the conversion result register 3, the count value CNT (=0) is selected by the selector 18 and is supplied as the selection signal SL3. In this way, in the conversion result register 3, the digital signal DO4 is stored in the result register RR0 by the selection signal SL3 and the initial A/D conversion terminates. The count value CNT of the counter 16 is incremented by the fall of the end signal END, with the result that the count value CNT becomes 1, whereupon the second A/D conversion is commenced.

In this second A/D conversion, the count value CNT is 1, so the scanning sequence register SR1 is selected by the selector 15, causing the value 0 that is set in this scanning sequence register SR1 to be supplied to the multiplexer 1 as the selection signal SL1. The input signal of the input terminal AI0 in this multiplexer 1 is selected in accordance with the selection signal SL1 and is supplied to the A/D converter 2.

This digital signal DO (DO0) that is obtained as a result of this conversion performed by the A/D converter 2 is output to the conversion result register 3 and an end signal END is output from the sequencer 19. Since the count value CNT (=1) is supplied as the selection signal SL3 to the conversion result register 3, the digital signal DO0 is stored in the result register RR1, and the second A/D conversion is terminated. The count value CNT of the counter 16 is incremented by the fail of the end signal END, with the result that the count value CNT becomes 2, whereupon the third A/D conversion is commenced.

By repetition of this action, A/D conversion is performed as far as the n-th conversion, at which the count value CNT of the counter 16 is n-1. Then, at the time point where the n-th A/D conversion has terminated, the start instruction STA is stopped, thereby stopping the A/D conversion operation. By the above operation, digital signals obtained by conversion in the order specified by the scanning registers SR0 to SRn-1 are sequentially stored in the result registers RR0 to RRn-1 of the conversion result register 3. After this, the conversion results stored in the result registers RR0 to RRn-1 of the conversion result register 3 are read via the bus 9 by the CPU or the like.

As described above, the A/D conversion device of this first embodiment has a conversion sequence setting register 12 for specifying the sequence of conversion of input signals in scanning mode, so it has the advantage that A/D conversion can be performed by selecting input signals in any desired order, irrespective of the hardware connections such as cables between the sensor and this A/D conversion device. Also, by selecting the same input signal a plurality of times during a single scan, it is possible to measure the amount of change of the input signal as a differential quantity with a fixed conversion interval, without involving software processing.

Second Embodiment

Figure 4:
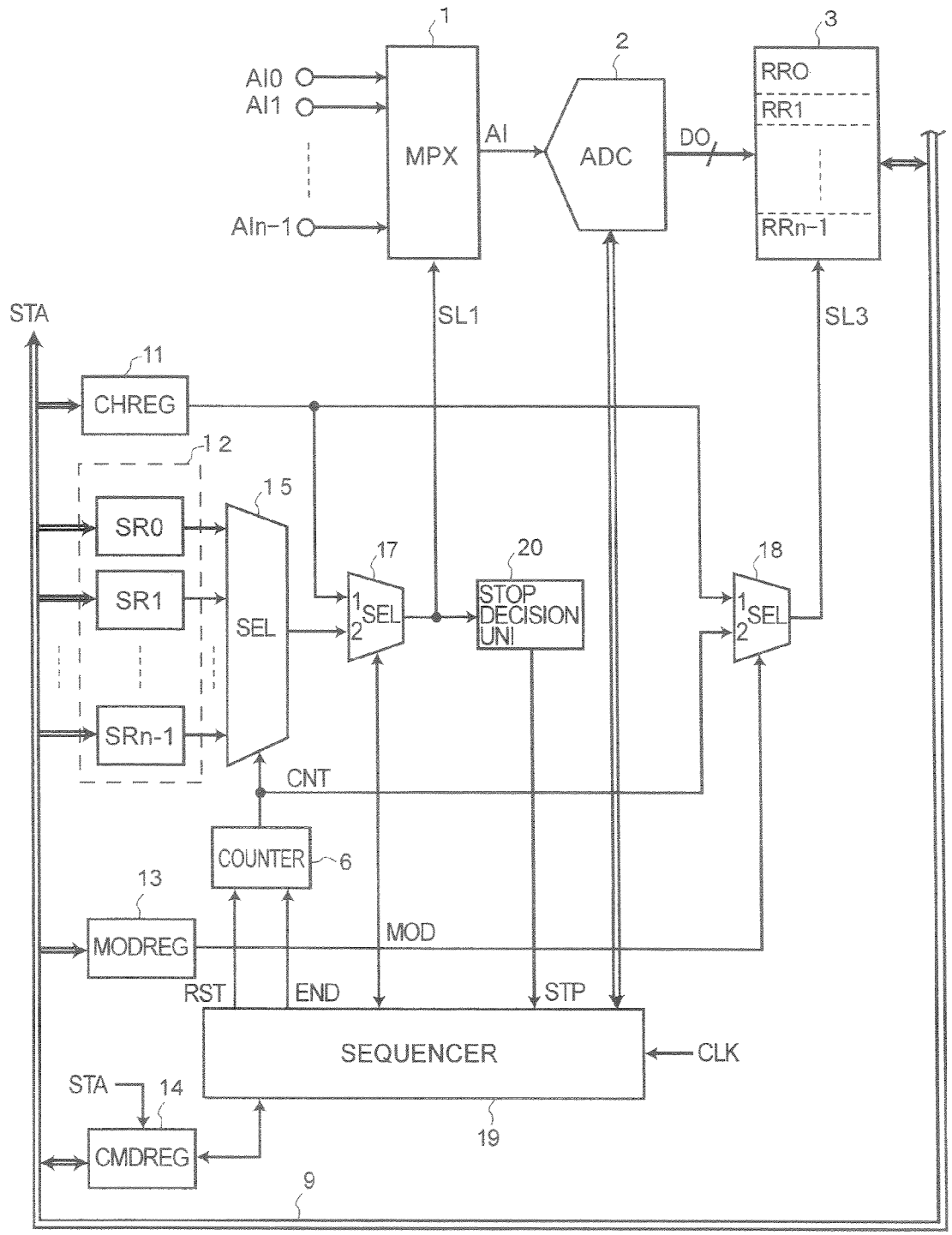
FIG. 4 is a layout diagram of an A/D conversion device showing a second embodiment of the present invention.

FIG. 4 is a layout diagram of an A/D conversion device showing a second embodiment of the present invention; elements that are common with elements in FIG. 2 are given the same reference numerals.

In the case of this A/D conversion device, the A/D conversion device of FIG. 1 is provided with a stop decision unit 20 and a sequencer 19A with some added functionality is provided instead of the sequencer 19.

When the selection signal SL1 that is output from the selector 17 has a value they cannot be coped with by the multiplexer 1 (for example the value n), or has a specified value (for example all 1's in binary) the stop decision unit 20 regards this as indicating stoppage of the conversion action and outputs a stop signal STP. Also, the sequencer 19A is provided with additional functionality in that, when this stop signal STP is supplied thereto. It stops the A/D conversion operation under the scanning mode. Other details of the construction are the same as in the case of FIG. 2.

In the case of this A/D conversion device, when A/D conversion is performed of for example only five input signals with a conversion operation in accordance with single scan mode, the channel numbers of the input signals that are to be converted are designated in order in the scanning sequence registers SR0 to SR4, and the channel number n is designated in the scanning sequence register SR5.

In this way, after A/D conversion of the input signal designated by the scanning sequence register SR4 has been completed, the channel number n that is read from the scanning sequence register SR5 is supplied to the stop decision unit 20. When the channel number n is supplied thereto, the stop decision unit 20 regards this as an instruction to stop the conversion operation, and outputs a stop signal STP to the sequencer 19A. As a result, the conversion operation under the scanning mode is forcibly stopped by the sequencer 19A.

As described above, the A/D conversion device of this second embodiment comprises a stop decision unit 20 that decides upon stoppage of the A/D conversion operation in accordance with the value of the channel number that is set in the scanning register.

In this way, in addition to the advantages of the first embodiment, the advantage is obtained that the A/D conversion action in the scanning mode can be stopped at the time point where an arbitrary channel number has been converted.

Third Embodiment

Figure 5:
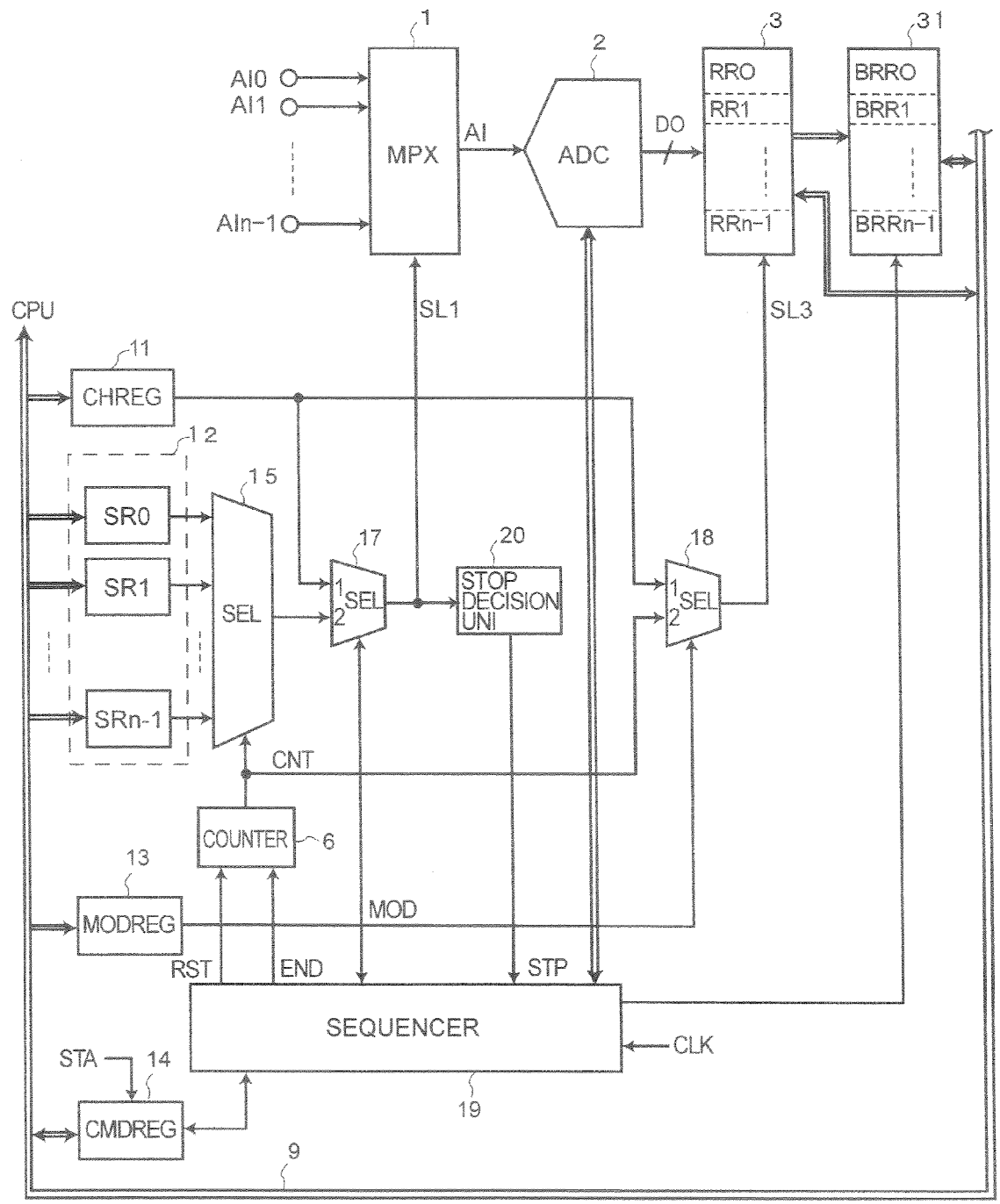
FIG. 5 is a layout diagram of an A/D conversion device showing a third embodiment of the present invention.

FIG. 5 is a layout diagram of an A/D conversion device showing a third embodiment of the present invention; elements that are common with elements in FIG. 4 are given the same reference numerals.

In this A/D conversion device, a back-up register 31 for purposes of backing up the conversion result register 3 is provided in the A/D conversion device of FIG. 4.

The back-up register 31 is connected with the bus under the control of the CPU or the like in the same way as is the conversion result register 3 and data is transferred to the back-up register 31 from this conversion result register 3. Otherwise the layout is the same as in the case of FIG. 4.

The timings with which the data of the conversion result register 3 is saved to the back-up register 31 are: when a conversion start instruction is input from the command register 14 through the bus by the CPU or the like; or when a conversion start instruction is input due to input of a start signal STA from another peripheral device; or when a conversion cycle is again commenced after completion of conversion corresponding to the number of times conversion is performed in the cycle, in the case of the continuous scanning mode.

Figure 6:
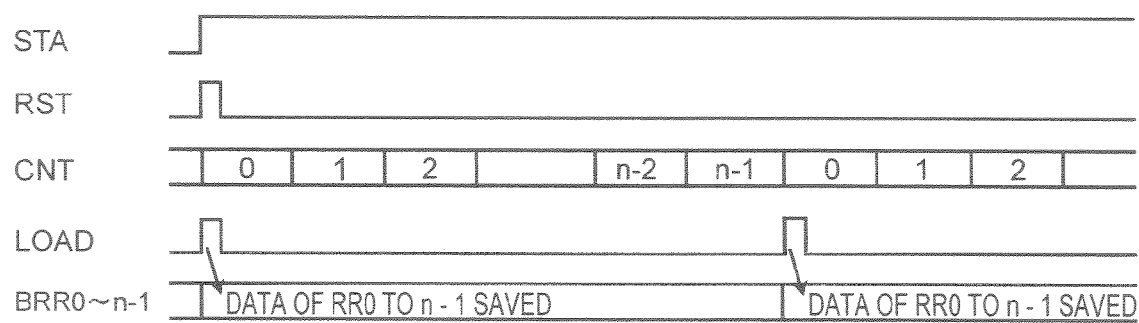
FIG. 6 is a diagram of the operation of scanning mode in the A/D conversion device of FIG. 5.

FIG. 6 is a diagram of the operation in which conversion is started in the continuous scanning mode in the A/D conversion device of FIG. 5, when a start signal STA is input from another peripheral device.

By means of this construction, it is possible to read the previous conversion results from the back-up register 31 even when conversion is started up, in the case where select mode, or a single cycle only of the scanning mode, is repeated by software. Also, in continuous scanning mode, after a conversion cycle has been completed, the conversion results of all of the set analogue signals can be saved from the conversion result register 3 to the back-up register 31, making it possible to read these again during the next conversion cycle, but with more latitude in terms of time.

As described above, the A/D conversion device according to this third embodiment has a construction whereby the designated analogue input conversion results can be stored in two register stages, namely, the conversion result register 3 and the back-up register: thus, on the next repetition of the conversion operation, the data of the previous conversion results is automatically saved. In this way, in addition to the same advantages as in the case of the first and second embodiments, the advantage is obtained that, regarding the processing time for A/D conversion, the restrictions in terms of time for software processing of the data of the conversion results via the bus by the CPU or the like are relaxed.

It should be noted that the present invention is not restricted to the embodiments described above and various modifications are possible. Examples of such modifications are as follows:—

(a) Although two operating modes, namely, scanning mode and select mode, were provided, it would be possible for only scanning mode to be provided. In this case, the channel number of the subject of conversion may be specified in the scanning sequence register SR0 of the conversion sequence setting register 12, and a specific value constituting a stop code may be set in the scanning sequence register SR1.

(b) It is not necessary that the number of analogue signals AI that are input to the multiplexer 1, the number of result registers RR of the conversion result register 3, and the number of scanning sequence registers SR of the conversion sequence setting register 12 should be the same.

(c) A further register in which the data of the back-up register 31 is itself saved may be provided. If the time for reading the conversion data from the bus under the control of the CPU or the like is large in relation to the A/D conversion time, a construction may be adopted in which several back-up register stages are provided,

INDUSTRIAL APPLICABILITY

In the present invention, there are provided a conversion sequence setting register in which is set the order in which the analogue signals are to be converted, and a multiplexer that selects analogue signals in the order that is set in this conversion sequence setting register. In this way, the analogue signals can be selected in any desired order, or the same analogue signal may be successively selected any number of times, or may be converted to a digital signal, irrespective of the sequence of connection defined by their hardware.

Also, when a plurality of analogue signals are consecutively converted to digital signals, the amount of software processing required for the timing of start-up of conversion and reading the conversion results can be reduced.

The invention claimed is:

1. An analogue/digital conversion device comprising:
a conversion sequence setting register in which an order analogue signals are converted when in a scanning mode during which a plurality of analogue signals are consecutively converted to digital signals is set;
a multiplexer that selects sequentially a single analogue signal from said plurality of analogue signals, in an order that is set in said conversion sequence setting register;
an analogue/digital converter that converts an analogue signal that is selected by said multiplexer to a digital signal and operable in the scanning mode for continuous A/D conversion of a plurality of input signals in a fixed order, and a select mode for individual A/D conversion of any desired input signal with any desired timing; and
a conversion result register having a plurality of storage regions, that stores a digital signal obtained as a result of a conversion by said analogue/digital converter in storage regions in an order with which conversion was effected.

2. The analogue/digital conversion device according to claim 1,
further comprising a stop decision unit that stops conversion by said analogue/digital converter when a predetermined number is selected in accordance with the order that is set in said conversion sequence setting register.

3. The analogue/digital conversion device according to claim 1 or claim 2,
further comprising a command register that is constituted such that an instruction for starting of conversion by said analogue/digital converter can be received by means of a start signal passing through a bus under the control of a processor, or a start signal from another peripheral device.

4. An analogue/digital conversion device comprising:
a multiplexer that selects a single analogue signal from a plurality of analogue signals in accordance with a first selection signal;
an analogue/digital converter that converts said analogue signal that is selected by said multiplexer to a digital signal;
a conversion result register having a plurality of storage regions, that stores a digital signal obtained as a result of a conversion by said analogue/digital converter in a corresponding storage region in accordance with a second selection signal;
a conversion channel setting register wherein a selection signal of an analogue signal to be converted is set, during a select mode in which a single analogue signal is selected and converted to a digital signal;
a conversion sequence setting register in which an order of analogue signals to be converted is set, during a scanning mode, in which a plurality of analogue signals are consecutively converted to digital signals;
a counter that counts number of times conversion is effected in scanning mode;
a structural unit that provides a continuous scanning mode whereby, after conversion is completed corresponding to number of times conversion is performed in one cycle in scanning mode, said scanning mode conversion cycle is again repeated, in accordance with the order that is set in said conversion sequence setting register;
a first selector whereby, in the case of a select mode, a selection signal that is set in said conversion channel setting register is supplied to said multiplexer as said first selection signal and, in the case of a scanning mode, said order that is output from said conversion sequence setting register specified by a count value of said counter is supplied to said multiplexer as said first selection signal; and
a second selector whereby, in the case of a select mode, a selection signal that is set in said conversion channel setting register is supplied to said conversion result register as said second selection signal and, in the case of a scanning mode, a count value of said counter is supplied to said conversion result register as said second selection signal.

5. The analogue/digital conversion device according to claim 4,
further comprising a stop decision unit that stops conversion by said analogue/digital converter when said order that is output from said conversion sequence setting register has reached a predetermined number in the case of said scanning mode.

6. The analogue/digital conversion device according to claim 5,
further comprising a back-up register having a plurality of storage regions in which data of said conversion result register that stores said digital signal converted by said analogue/digital converter is saved,
wherein data of said conversion result register is saved by said back-up register with a timing with which a conversion cycle is again commenced after conversion is completed corresponding to number of times conversion is performed in one cycle in said continuous scanning mode.

7. The analogue/digital conversion device according to claim 4 or claim 5,
further comprising a command register that is constituted such that an instruction for starting of conversion by said analogue/digital converter can be received by means of a start signal passing through a bus under the control of a processor, or a start signal from another peripheral device.

8. The analogue/digital conversion device according to claim 1 or claim 4,
further comprising a back-up register having a plurality of storage regions in which data of said conversion result register that stores the digital signal converted by said analogue/digital converter is saved,
wherein data of said conversion result register is saved by said back-up register with a timing with which said start-up signal obtained through said bus under the control of said processor or a start-up signal from another peripheral device is input from said command register to give instructions for start-up of conversion.

9. The analogue/digital conversion device according to claim 4,
further comprising a back-up register having a plurality of storage regions in which data of said conversion result register that stores said digital signal converted by said analogue/digital converter is saved,
wherein data of said conversion result register is saved by said back-up register with a timing with which a conversion cycle is again commenced after conversion is completed corresponding to number of times conversion is performed in one cycle in said continuous scanning mode.

* * * * *